(12) United States Patent
Kang et al.

(10) Patent No.: US 11,044,840 B2
(45) Date of Patent: Jun. 22, 2021

(54) DISPLAY DEVICE

(71) Applicant: LG ELECTRONICS INC., Seoul (KR)

(72) Inventors: Joon Kang, Seoul (KR); Hyoseok Lee, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

(21) Appl. No.: 16/750,275

(22) Filed: Jan. 23, 2020

(65) Prior Publication Data

US 2020/0245512 A1 Jul. 30, 2020

(30) Foreign Application Priority Data

Jan. 25, 2019 (KR) .................. KR10-2019-0009896

(51) Int. Cl.
*H05K 7/20* (2006.01)
*G09F 9/33* (2006.01)
*G09F 9/35* (2006.01)
*H05K 5/00* (2006.01)

(52) U.S. Cl.
CPC .......... *H05K 7/20972* (2013.01); *G09F 9/33* (2013.01); *G09F 9/35* (2013.01); *H05K 5/0017* (2013.01); *H05K 7/20209* (2013.01)

(58) Field of Classification Search
CPC .......... H05K 7/20972; H05K 7/20209; H05K 7/20145; H05K 7/202; H05K 5/0017; G09F 9/33; G09F 9/35
See application file for complete search history.

(56) References Cited

U.S. PATENT DOCUMENTS

| | | | |
|---|---|---|---|
| 7,830,660 B2 | 11/2010 | Kang et al. | |
| 2011/0013114 A1 | 1/2011 | Dunn et al. | |
| 2012/0105790 A1* | 5/2012 | Hubbard | H05K 7/20127 349/161 |
| 2016/0198589 A1* | 7/2016 | Kang | H05K 7/20154 361/692 |
| 2017/0172016 A1 | 6/2017 | Kang | |
| 2018/0317350 A1* | 11/2018 | Dunn | H05K 7/20963 |

FOREIGN PATENT DOCUMENTS

| | | |
|---|---|---|
| GB | 2 561 893 | 10/2018 |
| KR | 10-2016-0084279 | 7/2016 |
| KR | 10-2017-0068798 | 6/2017 |

OTHER PUBLICATIONS

European Search Report dated Jun. 19, 2020 issued in Application No. 20153691.9.
Korean Office Action dated Nov. 28, 2019 issued in 10-2019-0009896.

* cited by examiner

*Primary Examiner* — Mukundbhai G Patel
(74) *Attorney, Agent, or Firm* — Ked & Associates LLP

(57) ABSTRACT

The present disclosure relates to a display device, which may include a case having a front surface on which a display screen is displayed, a rear surface opposite to the front surface, a top surface connecting upper ends of the front surface and the rear surface, and a bottom surface opposite to the top surface, a display panel accommodated in the case, a heat exchanger mounted inside the case and configured to cause heat exchange between internal air circulating along front and rear surfaces of the display panel and external air introduced from outside of the case, and a suction fan mounted inside the case and configured to suck the external air into a lower portion of the heat exchanger.

15 Claims, 10 Drawing Sheets

→ : INSIDE AIR

⇨ : OUTSIDE AIR

DISPLAY DEVICE

CROSS-REFERENCE TO RELATED APPLICATION

Pursuant to 35 U.S.C. § 119(a), this application claims the benefit of an earlier filing date and the right of priority to Korean Patent Application No. 10-2019-0009896, filed on Jan. 25, 2019, the contents of which is incorporated by reference herein in its entirety.

BACKGROUND

1. Technical Field

The present disclosure relates to a display device, and one particular implementation relates to a cooling system of a display device for ensuring a stable operation in an outdoor environment.

2. Description of the Related Art

Liquid crystal displays (LCDs) or Organic Light Emitting Diodes (OLEDs), which are widely used as displays, can be manufactured in a shape of a flat plate and are getting larger in area.

Signage, in particular, is called a fourth screen, following TV, PC, or mobile devices, and refers to a display installed in a public or commercial space. Signage is a product that is quickly replacing existing outdoor advertisements while providing various contents in combination with an information and communication technology (ICT), and is commonly found in places with a large population, such as subway stations, bus stops, apartment elevators, banks, and the like.

In outdoor displays, their temperatures rise due to various causes, such as radiant heat generated by sunlight, temperatures of surrounding environments, heat generated by making such displays brighter due to bright surrounding environments, and the like.

If the temperature of a display rises, it is likely to cause an error, like failing to display a screen due to a malfunction. Therefore, cooling of the display is performed while the display is in operation.

In particular, as the display becomes larger, efficient cooling for the display is required.

US Patent Laid-open Publication No. US20170172016A1 (published on Jun. 15, 2017) discloses an outdoor display device having a cooling structure.

The cooling structure of the patent literature is configured to cool a display panel in a manner that air circulating along front and rear surfaces of the display panel inside a case and air introduced from outside to inside of the case exchange heat with each other while flowing in opposite directions.

However, with the structure disclosed in the patent literature, a fan for sucking external air is disposed in an intake port formed through a rear surface of the case and exposed to the outside of the case. Accordingly, contaminants are easily introduced into the suction fan when the external air is sucked.

The contaminants are stuck on the fan, which makes it difficult for the external air to be smoothly sucked into the case.

In addition, the externally exposed suction fan may be highly likely to be damaged when an external impact is applied to it, and noise generated in the suction fan may be easily delivered to consumers.

In addition, external air which is heated after heat exchange in a heat exchanger is discharged to the rear surface of the case and blown to the consumers, which causes the consumer's inconvenience.

SUMMARY

The present disclosure has been invented in order to solve the aforementioned problems. One aspect of the present disclosure is to provide a display device, in which an external air suction fan is mounted inside a case without being exposed to outside of the case, so as to prevent an introduction of contaminants into the suction fan, protect the suction fan from an external impact, and minimize a delivery of noise of the suction fan to the outside.

Another aspect of the present disclosure is to provide a display device, in which an outlet port through which hot air is discharged from inside to outside of a case after heat exchange is formed at an upper portion of the case, so as to prevent the discharged hot air from moving toward consumers.

Still another aspect of the present disclosure is to provide a display device, in which a rear surface of a display panel can be directly cooled by external air, so as to improve cooling performance.

In order to achieve these and other advantages and in accordance with the purpose of this specification, as embodied and broadly described herein, there is provided a display device, which may include a case having a front surface on which a display screen is displayed, a rear surface opposite to the front surface, a top surface connecting upper ends of the front surface and the rear surface, and a bottom surface opposite to the top surface, a display panel accommodated in the case, a heat exchanger mounted inside the case and configured to cause heat exchange between internal air circulating along front and rear surfaces of the display panel and external air introduced from outside of the case, and a suction fan mounted inside the case and configured to suck the external air into a lower portion of the heat exchanger.

According to one embodiment disclosed herein, the suction fan may be disposed below the heat exchanger.

According to one embodiment disclosed herein, the device may further include a cooling passage defined at the rear surface of the display panel so that the external air flows therethrough so as to cool the display panel.

According to one embodiment disclosed herein, the device may further include a plurality of intake ports formed through the top surface of the case so that the external air is sucked therein, and a plurality of exhaust ports formed through the top surface of the case so that the external air heat-exchanged with the internal air is discharged to outside therethrough.

According to one embodiment disclosed herein, the heat exchanger may be disposed at the rear of the cooling passage.

According to one embodiment disclosed herein, the cooling passage may have the same size as the display panel.

According to one embodiment disclosed herein, the suction fan may be disposed between the cooling passage and the heat exchanger to allow the external air passed through the cooling passage to be discharged into a lower portion of the heat exchanger.

According to one embodiment disclosed herein, the suction fan may be disposed in a lower portion of the cooling passage.

According to one embodiment disclosed herein, the display panel may be provided with a backlight on a rear surface thereof, and the backlight may be cooled by the external air.

According to one embodiment disclosed herein, the device may include a circulation passage defined in a closed-loop shape in the case so that the internal air circulates therealong, and a circulation fan providing circulation power to the internal air. The circulation passage may be defined in a shape of "O" by including a front passage defined between the front surface of the case and the front surface of the display panel, a rear passage defined in the rear surface of the case to be opposite to the front passage, and a plurality of side passages respectively defined in both side surfaces of the case and configured to communicate the front passage with the rear passage.

According to one embodiment disclosed herein, the device may further include an intake port formed through the top surface of the case, an exhaust port formed through the top surface of the case to be spaced rearward from the intake port, and an external air passage having one side communicating with the intake port and another side communicating with the exhaust port, and extending in a direction intersecting with the circulation passage inside the case.

According to one embodiment disclosed herein, the external air passage may be defined in a shape of "U" by including a cooling passage disposed at a rear surface of the display panel and extending downward from the intake port, and a return passage disposed at a rear surface of the cooling passage, having a lower side communicating with a lower end of the cooling passage and an upper side extending upward toward the exhaust port so that the external air is returned to the exhaust port. The suction fan may be disposed between a lower side of the cooling passage and a lower side of the return passage.

According to one embodiment disclosed herein, the heat exchanger may be provided in plurality in the rear of the case, and disposed to be spaced apart from each other in right and left directions of the case.

According to one embodiment disclosed herein, the heat exchanger may be provided by one in number, installed in the rear of the case to be located in a central portion of the case or to be located adjacent to a side of the case.

According to one embodiment disclosed herein, the device may further include a plurality of intake guides communicating with the intake port and inclined toward the rear surface of the case inside the case, and a plurality of exhaust guides communicating with the exhaust port and inclined toward the front surface of the case inside the case, so that external air discharged through the exhaust port is isolated from external air introduced into the intake port.

Hereinafter, effects of a display device according to an implementation of the present disclosure will be described.

First, suction fans may be disposed deep inside a case in a direction, in which external air is sucked, without being exposed to outside, so as to be prevented from being contaminated due to contaminants introduced therein. Also, since the suction fans are disposed inside the case 100, the suction fans can be protected in advance from accidental penetration of skewers, for example, or an external impact. Noise which is caused by the operation of the suction fans 126 and transferred to outside can also be minimized.

Second, as exhaust ports are formed through a top surface of the case so that hot air heated by heat transferred from internal air can be discharged in an upward direction of the case, the hot air cannot be transferred to consumers or pedestrians, thereby solving consumers' complaints.

Third, as a cooling passage along which external air flows is formed at a rear surface of a display panel, the external air flowing along the cooling passage can come into contact with the rear surface of the display panel and directly cool the display panel, thereby enhancing cooling efficiency.

Fourth, the cooling passage and return passage through which external air flows are arranged in a two-layered structure in front and rear directions of the case with a partition wall interposed therebetween, and heat exchangers are disposed in a rear second layer of the two layers to be flush with the return passage. This may result in making the case slim.

Fifth, the heat exchangers are disposed at the rear surface of the case 100 so as to obtain a larger area, and to secure cooling performance for reducing an increase in surface temperatures of the display panel and the case due to sunlight.

Sixth, other circuit elements, such as a main board, a power supply unit, an LED driver, and the like, other than the display panel, are disposed between first and second heat exchangers, and internal air flowing along a circulation passage in a closed-loop structure, for example, a shape like "O", can simultaneously cool a front surface of the display panel, and heat-generating circuits, such as the power supply unit, the LED driver, and the like. This may result in satisfying lifespans and reliability required for the display panel and other circuit elements.

Seventh, since an LED backlight may be disposed on the rear surface of the display panel, external air introduced through the cooling passage can easily cool the LED backlight.

Eighth, with the configuration that a plurality of intake ports and exhaust ports are located on the top surface of the case, a plurality of intake guides extends from the intake ports to be inclined downward from front to rear sides in the case, and a plurality of exhaust guides extends from the exhaust ports to be inclined upward from the front to rear sides in the case, hot air discharged from the top surface of the case can be prevented from re-circulating into the intake ports.

DETAILED DESCRIPTION OF THE EMBODIMENTS

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings. The idea of the present disclosure should be construed to extend to any alterations, equivalents and substitutes besides the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be connected with the another element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Figure 1:
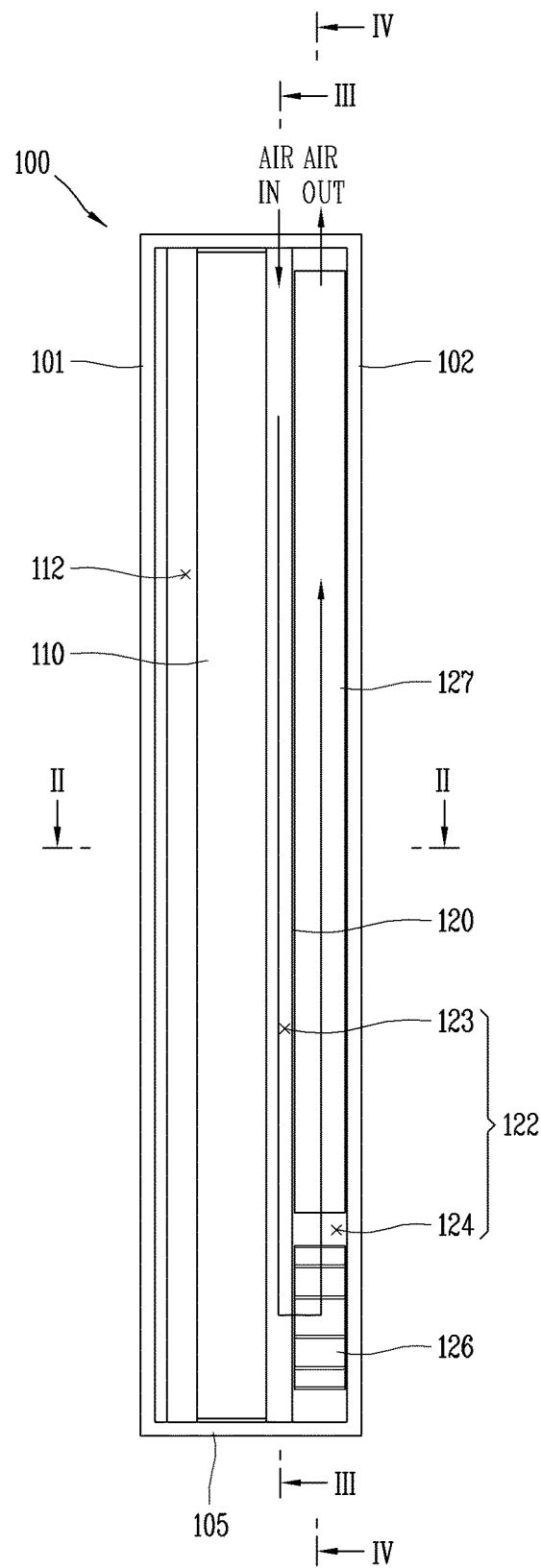
FIG. 1 is a conceptual view of a display device according to the present disclosure, viewed from a side surface.
Figure 2:
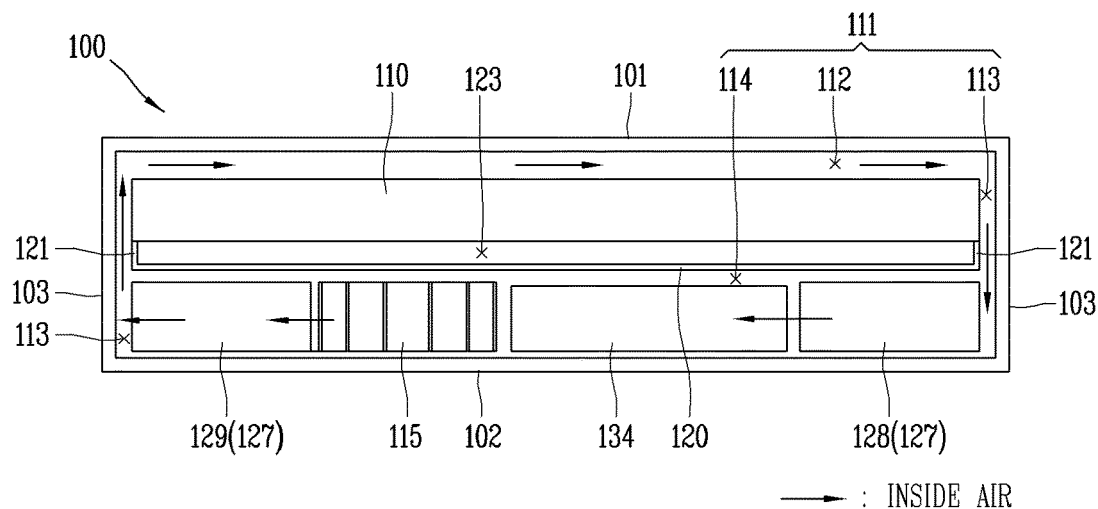
FIG. 2 is a sectional view taken along the line II-II of FIG. 1.
Figure 3:
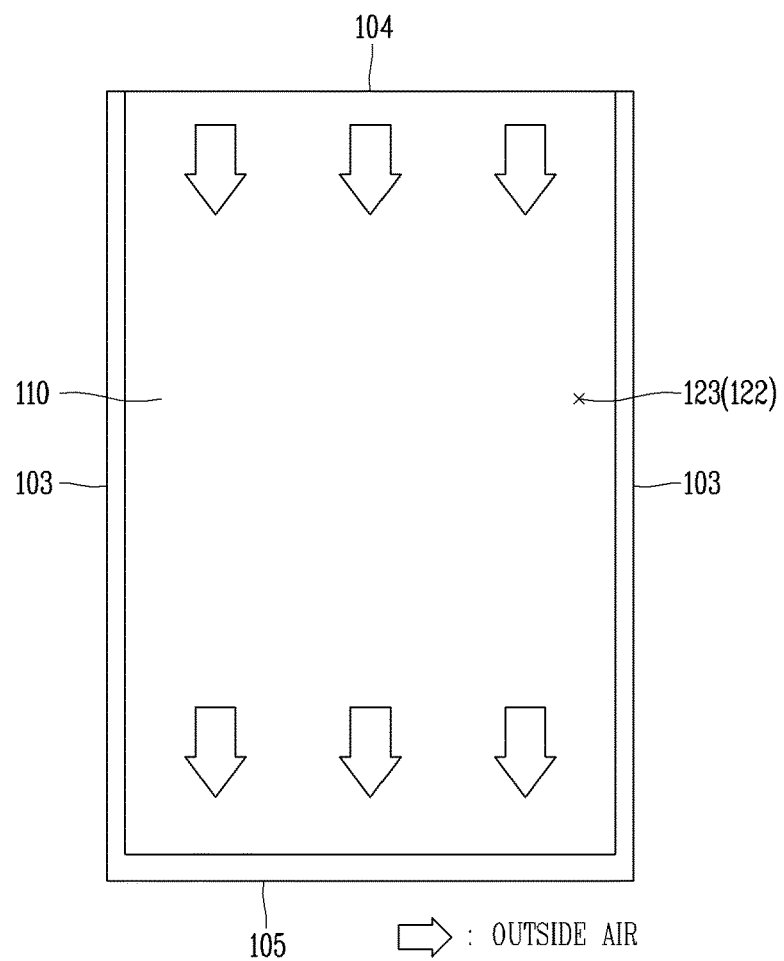
FIG. 3 is a rear view illustrating a state in which external air is introduced along a cooling passage, taken along the III-III of FIG. 1.
Figure 4:
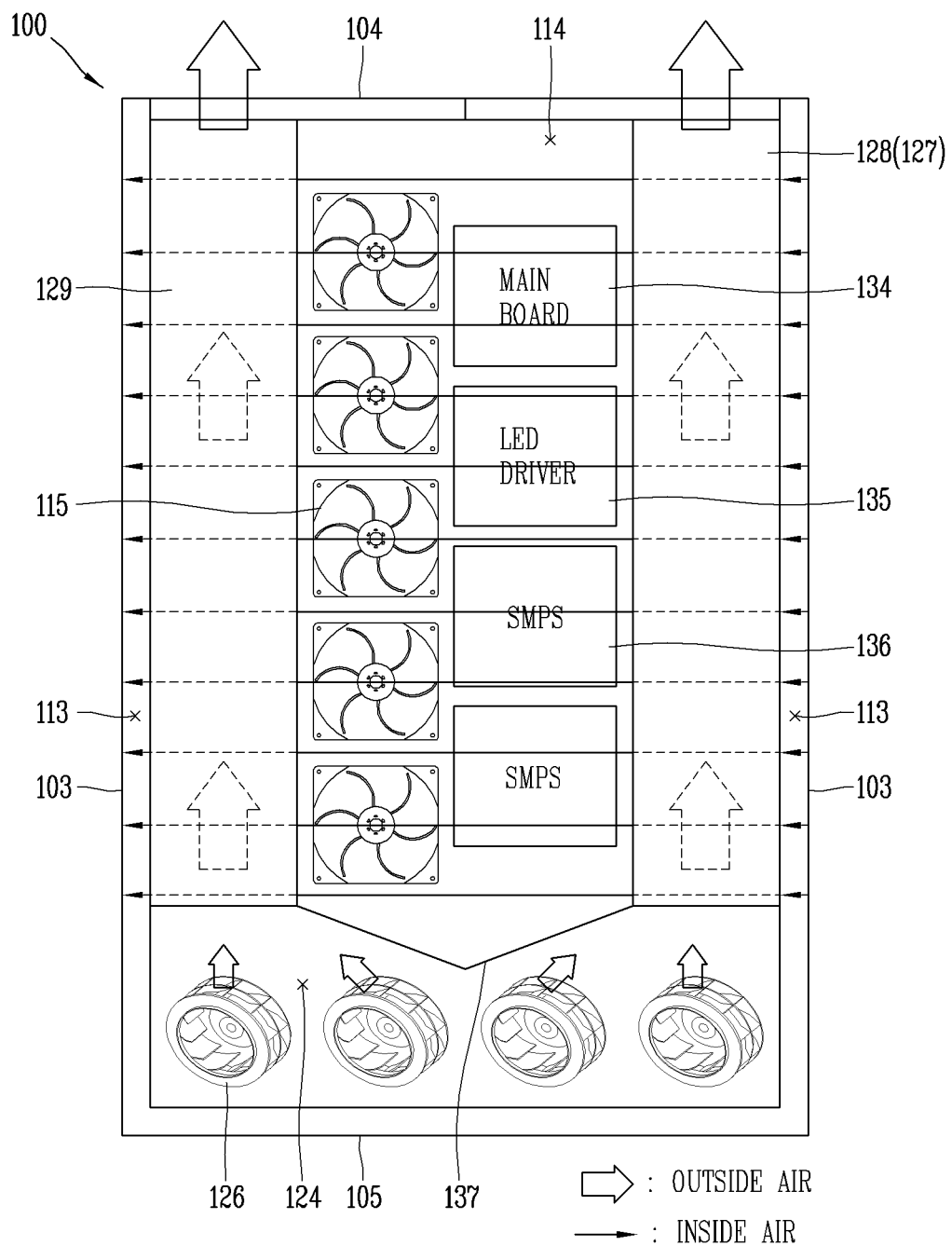
FIG. 4 is a rear view illustrating a state in which external air is discharged through a return passage via a heat exchanger, taken along the line IV-IV of FIG. 1.
Figure 5:
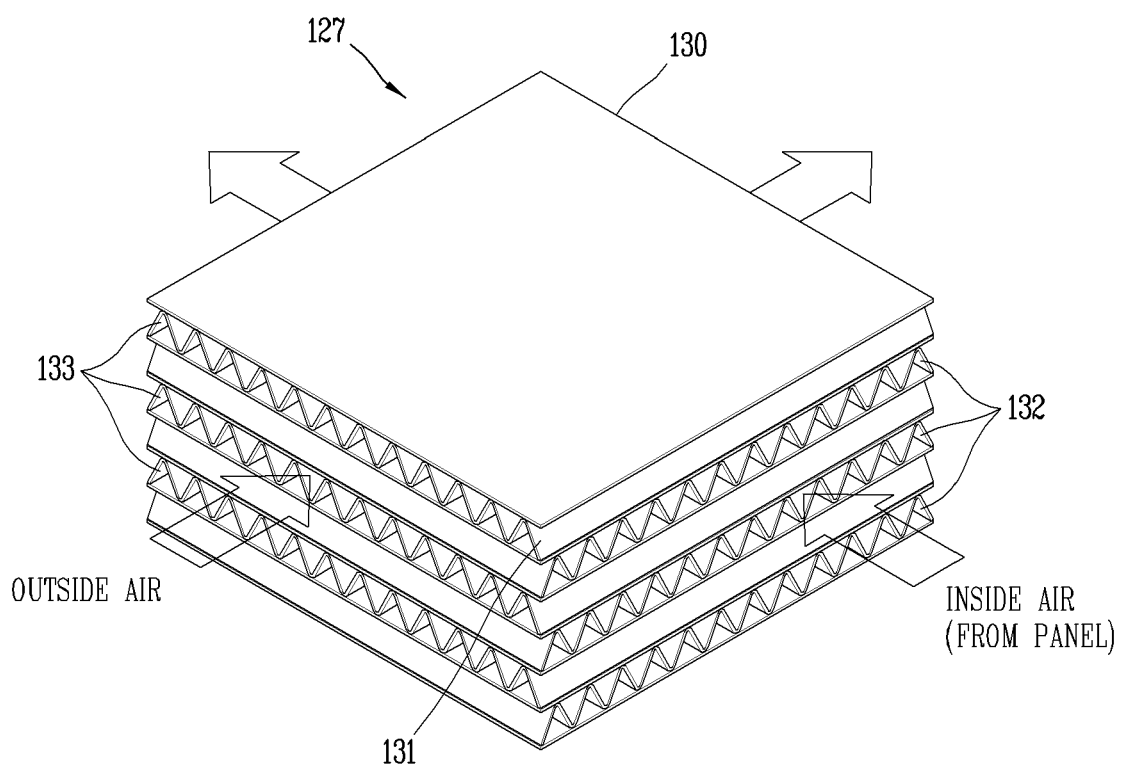
FIG. 5 is a conceptual view illustrating a structure of a heat exchange passage of the heat exchanger in FIG. 4.
Figure 6:
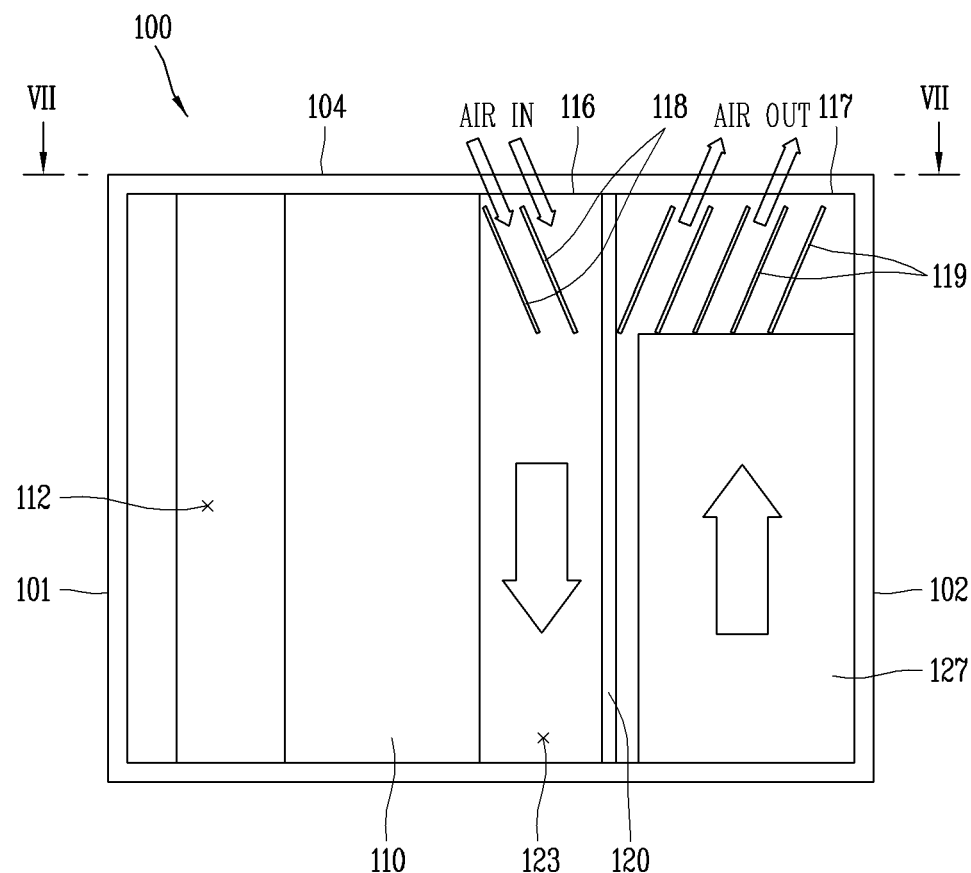
FIG. 6 is a conceptual view illustrating a state in which an intake port and an exhaust port formed on a top surface of a case are spaced apart from each other in FIG. 1.
Figure 7:
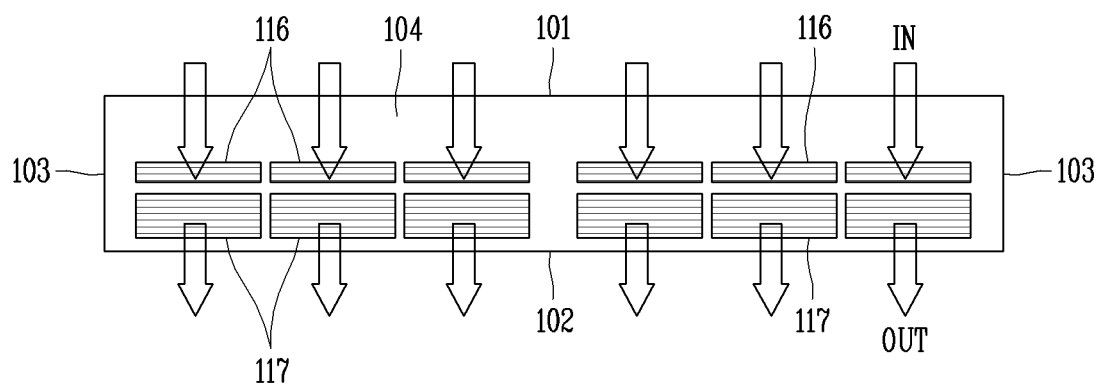
FIG. 7 is a planar view illustrating an intake port and an exhaust port, taken along the line VII-VII in FIG. 6.

FIG. 1 is a conceptual view of a display device according to the present disclosure, viewed from a side, FIG. 2 is a sectional view taken along the line II-II of FIG. 1, FIG. 3 is a rear view illustrating a state in which external air is introduced along a cooling passage 123, taken along the III-III of FIG. 1, FIG. 4 is a rear view illustrating a state in which external air is discharged through a return passage 124 via a heat exchanger 127, taken along the line IV-IV of FIG. 1, FIG. 5 is a conceptual view illustrating a structure of a heat exchange passage of the heat exchanger 127 in FIG. 4, FIG. 6 is a conceptual view illustrating a state in which an intake port 116 and an exhaust port 117 formed on an top surface 104 of a case 100 are spaced apart from each other in FIG. 1, and FIG. 7 is a planar view illustrating the intake port 116 and the exhaust port 117, taken along the line VII-VII in FIG. 6.

The display device according to the present disclosure may include a case 100, a display panel 110, electrical components such as a main board 134, a cooling device such as a heat exchanger 127, etc.

The case 100 may have a rectangular shape.

The case 100 may include a front surface 101, a rear surface 102, side surfaces 103, a top surface 104, and a bottom surface 105.

The case 100 may be vertically long when viewed from the front.

However, the present disclosure is not limited thereto, and the case 100 may have a wide shape which is horizontally long when viewed from the front.

The case 100 is preferably formed in a slim shape which is thin in front and rear directions.

The front surface 101 may be formed of a transparent material so that a display screen is projected toward the front.

An accommodation space may be formed in the case 100, and the display panel 110 may be accommodated in the case 100.

The front surface 101, the rear surface 102, the side surfaces 103, the top surface 104, and the bottom surface 105 of the case 100 may be configured to surround the display panel 110.

A circulation passage 111 may be defined in the case 100 so that air can circulate in the case 100.

The circulation passage 111 may have a closed-loop structure defined inside the front surface 101, the rear surface 102, and the side surfaces 103 of the case 100.

The circulation passage 111 may include a front passage 112, side passages 113, and a rear passage 114.

The front passage 112 may be defined between the front surface 101 of the case 100 and a front surface of the display panel 110.

The rear passage 114 may be defined between the rear surface 102 of the case 100 and a rear surface of the display panel 110.

The side passages 113 may be defined between both of the side surfaces 103 of the case 100 and both side surfaces of the display panel 110, respectively.

Circulation fans 115 may be installed in the rear passage 114, and may be driven by fan motors to provide power to circulate internal air of the case 100.

With this configuration, the internal air of the case 100 may circulate while forming a closed-loop, for example, in a shape of "O", repeatedly along the front passage 112, one of the side passages 113, the rear passage 114 and the other side passage 113, by the circulation fans 115.

An intake port 116 and an exhaust port 117 may be formed at the top surface 104 of the case 100. The intake port 116 and the exhaust port 117 may be separated (isolated or spaced) from each other.

The intake port 116 may be provided in plurality disposed to be spaced apart from one another in left and right directions of the case 100. Each of the plurality of intake ports 116 may be formed long in the left and right directions of the case 100.

The exhaust port 117 may be provided in plurality disposed at the rear of the intake ports 116 in the front and rear directions of the case 100.

The plurality of exhaust ports 117 may be disposed to be spaced apart from one another in the left and right directions of the case 100.

Each of the plurality of exhaust ports 117 may be formed long in the left and right directions of the case 100.

Referring to FIGS. 6 and 7, a plurality of intake guides 118 may extend from the intake port 116 inside the case 100. The plurality of intake guides 118 may be disposed to be spaced apart from one another in the front and rear directions of the case 100.

The plurality of intake guides 118 may be inclined. An upper end of each intake guide 118 may be disposed to get close to the rear surface of the display panel 110, and a lower end of the intake guide 118 may be disposed to get spaced apart from the display panel 110.

A plurality of exhaust guides 119 may extend from the exhaust ports 117 inside the case 100. The plurality of exhaust guides 119 may be disposed to be spaced apart from one another in the front and rear directions of the case 100.

The plurality of exhaust guides 119 may be inclined in an opposite direction to the intake guides 118.

Each of the plurality of exhaust guides 119 may be inclined to be away from the rear surface 102 of the case 100 from an upper end toward a lower end.

The exhaust port 117 may be formed wider than the intake port 116 in the front and rear directions of the case 100. The plurality of exhaust guides 119 may be provided more in number than the plurality of intake guides 118.

A partition wall 120 may be provided inside the case 100. The partition wall 120 may be configured to isolate the intake port 116 and the exhaust port 117 from each other. The partition wall 120 may be configured to isolate or separate the intake guides 118 and the exhaust guides 119.

The partition wall 120 may extend perpendicularly in up and down directions to divide the accommodation space inside the case 100 into two front and rear layers.

The display panel 110 may be accommodated in the first layer located at the front of the two layers, and the heat exchanger 127 may be accommodated in the second layer located at the rear.

An external air passage 122 may be provided inside the case 100. The external air passage 122 may configured such that external air flows therealong. The external air passage 122 may be configured as a non-circulation type. Thus, external air introduced into the external air passage 122 through the intake ports 116 may be discharged through the exhaust ports 117.

The external air passage 122 may be configured to be isolated from the circulation passage 111 to prevent external air from being mixed with internal air.

The external air passage 122 may include a cooling passage 123 and a return passage 124.

The cooling passage 123 may be defined between the rear surface of the display panel 110 and the partition wall 120. An upper end of the cooling passage 123 may communicate with the intake port 116, and a lower end of the cooling passage 123 may communicate with the return passage 124.

Side walls 121 may protrude from both end portions of the partition wall 120 and extend to be in contact with both ends of the rear surface of the display panel 110. The side walls 121 may isolate the cooling passage 123 and the circulation passage 111 from each other. With this configuration, external air introduced into the cooling passage 123 can move downward without being mixed with internal air which flows along the side passages 113.

The return passage 124 may be defined between the partition wall 120 and the rear surface 102 of the case 100.

The cooling passage 123 and the return passage 124 may be partitioned by the partition wall 120, and the return passage 124 may be disposed behind the cooling passage 123. A communication hole through which the cooling passage 123 and the return passage 124 communicate with each other may be formed at a lower end portion of the partition wall 120.

The cooling passage 123 and the return passage 124 may communicate with the intake port 116 and the exhaust port 117, respectively, so as to be configured in an open structure.

The cooling passage 123 and the return passage 124 may be formed such that external air flows in a shape like "U".

With this configuration, the cooling passage 123 may allow external air to come into direct contact with the rear surface of the display panel 110, so as to directly cool the display panel 110.

The return passage 124 may be configured to turn a flowing direction of external air to a direction opposite to the cooling passage 123.

The return passage 124 may be defined by a surface of the partition wall 120, which is opposite to another surface of the partition wall 120 where the cooling passage 123 is defined.

A lower side of the return passage 124 may communicate with a lower end of the cooling passage 123 through the communication hole, and an upper side thereof may communicate with the exhaust port 117.

A plurality of suction fans 126 may be provided inside the case 100. The suction fans 126 are connected to fan motors. As the suction fans 126 are rotated in response to an operation of the fan motors, external air can be sucked into the cooling passage 123.

The plurality of suction fans 126 may be spaced apart from one another in the left and right directions inside the bottom surface 105 of the case 100.

The plurality of suction fans 126 may be disposed to be adjacent to the communication hole, and may allow external air to flow along the cooling passage 123 and the return passage 124.

The suction fans 126 may be disposed between the cooling passage 123 and the return passage 124. The suction fans 126 may be disposed in a lower end portion of the cooling passage 123 or in the return passage 124. In this embodiment, the suction fans 126 are disposed in the return passage 124.

External air may move downward along the cooling passage 123 through the intake port 116, and may move upward along the return passage 124 after passing through the suction fans 126.

The heat exchanger 127 may be disposed above the return passage 124. The heat exchanger 127 is a mechanism by which external air and internal circulation air exchange heat with each other. Internal air is a heat transfer fluid that receives hot air or heat from the display panel 110 and the like and transfers the received hot air or heat to external air.

External air is a heat transfer fluid that comes into contact with the display panel 110 to directly cool the display panel 110, and discharges heat transferred from internal air (or internal circulation air) to the outside of the case 100.

The second layer, which is a rear space of the case 100, may include the rear passage 114 and the return passage 124.

The heat exchanger 127 may be provided in plurality disposed at both right and left sides in the rear passage 114 in a spaced manner. The plurality of heat exchangers 127 may include a first heat exchanger 128 disposed upstream and a second heat exchanger 129 disposed downstream based on a flowing direction of internal air.

Between the first and second heat exchangers 128 and 129 in both the left and right sides of the rear passage 114 may be provided a plurality of circulation fans 115, a main board 134, an LED driver 135, a plurality of Switching Mode Power Supplies (SMPSs) 136, and the like.

The SMPS 136 corresponds to a power supply unit.

The return passage 124 may be disposed below the rear passage 114. The rear passage 114 and the return passage 124 may be isolated from each other by a lower partition wall 137. The lower partition wall 137 may protrude in the front and rear directions from a rear surface of the partition wall 120 to the rear surface 102 of the case 100.

The lower partition wall 137 may be formed in a shape like "V" which is gently inclined from a central portion to right and left sides. The lower partition wall 137 may be upwardly inclined toward both end portions of the case 100. Both end portions of the lower partition wall 137 may be connected to lower portions of the heat exchangers 127, respectively, so that both sides of the return passage 124 can be diverged to communicate with the heat exchangers 127.

The return passage 124 may connect the plurality of heat exchangers 127 in parallel, and may distribute external air so that a uniform amount of external air can flow into each of the plurality of heat exchangers 127.

The lower partition wall 137 may guide external air from the return passage into the plurality of heat exchangers 127 disposed at its right and left sides.

The plurality of circulation fans 115 may be spaced apart from one another in the up and down directions, so as to provide circulation power to internal air. The plurality of circulation fans 115 may be configured such that air can flow in the right and left directions.

In this implementation, the plurality of circulation fans 115 allows internal circulation air from the right side surface 103 to the left side surface 103 when viewed from the rear surface 102 of the case 100.

The lower partition wall 137 may isolate internal air flowing along the rear passage 114 from external air flowing along the return passage 124, to prevent mixing of the internal and external air.

The heat exchangers 127 may be formed in a plate-like shape. The heat exchanger 127 may be configured by stacking or laminating a plurality of first passage parts 132 and a plurality of second passage parts 133.

The first passage parts 132 and the second passage parts 133 may be formed in an intersecting direction.

For example, the plurality of first passage parts 132 may extend in a horizontal direction, so that internal air can flow toward the right and left sides of the case 100 along the first passage parts 132.

The plurality of second passage parts 133 may extend in the up and down directions of the case 100, so that external air can flow in the up and down directions of the case 100 along the second passage parts 133.

The plurality of first passage parts 132 and the plurality of second passage parts 133 may be alternately arranged in the stacking direction.

Each of the plurality of first passage parts 132 may include a plurality of flat portions 130 spaced apart from each other in the stacking direction, and a curved portion 131 formed in a sine wave shape between the plurality of flat portions 130.

The plurality of flat portions 130 may connect top points and bottom points of the curved portion 131, which are spaced apart from each other in the up and down directions of the case 100, so as to define the first passage parts 132 between the flat portions 130 and the curved portion 131.

The plurality of first passage parts 132 may be configured such that a passage direction extends in the right and left directions. The plurality of first passage parts 132 may be spaced apart from one another in the up and down directions.

Both ends of each of the plurality of first passage parts 132 may be opened to communicate with the side passages 1113 of the case 100, so that internal air can flow from the side passage to the right and left sides of the case 100 along the first passage parts 132.

The plurality of second passage parts 133 are configured to be the same as or similar to the first passage parts 132, except for the passage direction of the curved portion 131.

The plurality of second passage parts 133 may be configured such that the passage direction extends in the up and down directions of the case 100. The plurality of second passage parts 133 may be spaced apart from one another in the up and down directions of the case 100.

A lower end of each of the plurality of second passage parts 133 may be opened to communicate with the return passage 124, and an upper end of each of the plurality of second passage parts 133 may be opened to communicate with the exhaust port 117.

With this configuration, internal air can repeatedly circulate while forming a closed loop, in a manner of moving toward one side along the front passage 112 of the case 100 by the circulation fans 115, moving from the front passage 112 to the rear passage 114 along the side passage 113 disposed at the one side, moving toward another side along the first passage parts 132 of the heat exchanger 127 disposed in the rear passage 114, and moving from the first passage parts 132 to the front passage 112 along the side passage 113 disposed at the another side. During the circulation, the internal air can absorb heat generated from the front surface and the side surfaces of the display panel 110, the main board 134, the LCD driver 135, the SMPSs 136, and the like.

Internal air can perform heat-exchange with external air by the heat exchanger 127, so that heat can be transferred from the internal air to the external air.

External air may be sucked by the suction fans 126 into the cooling passage 123 formed at the rear surface of the display panel 110 through the intake port 116 formed through the top surface 104 of the case 100, flow down along the cooling passage 123, pass through the suction fans 126 through the communication hole, and then flow by turning upward along the return passage 124. In this instance, the lower partition wall 137 which is inclined to the right and left sides of the case 100 may allow the external air to flow from the return passage 124 to lower portions of the heat exchangers 127.

Subsequently, the external air may flow along the second passage parts 133 from lower ends to upper ends of the heat exchangers 127, so as to be discharged upward to the outside of the case 100 through the exhaust port 117 formed through the top surface 104 of the case 100.

Here, internal air may cool the front surface of the display panel 110 while flowing along the front passage 112. Then, the internal air may primarily be cooled by external air while passing through the first heat exchanger 128, which is disposed upstream based on the flowing direction of the internal air, of the plurality of heat exchangers 127.

The primarily cooled internal air may cool circuit elements, such as the main board 134, the SMPSs 136, the LED driver 135, and the like, while passing through these elements, and then be cooled secondarily by the external air while passing through the second heat exchanger 129.

Therefore, according to the implementation of the present disclosure, the suction fans 126 may be disposed deep inside the case 100 in a direction, in which external air is sucked, without being exposed to outside, so as to be prevented from being contaminated due to contaminants introduced therein. In addition, since the suction fans 126 are disposed inside the case 100, the suction fans 126 can be protected in advance from accidental penetration of skewers, for example, or an external impact. Noise which is caused by the operation of the suction fans 126 and transferred to outside can also be minimized.

As the exhaust port 117 is formed through the top surface 104 of the case 100 so that hot air heated by heat transferred from internal air can be discharged in an upward direction of the case 100, the hot air cannot be transferred to consumers or pedestrians, thereby solving consumers' complaints.

As the cooling passage 123 along which external air flows is formed at the rear surface of the display panel 110, the external air flowing along the cooling passage 123 can come into contact with the rear surface of the display panel 110 and directly cool the display panel 110, thereby enhancing cooling efficiency.

The cooling passage 123 and the return passage 124 through which external air flow are arranged in a two-layered structure in the front and rear directions of the case 100 with the partition wall 120 interposed therebetween, and the heat exchangers 127 are disposed in the rear second layer of the two layers to be flush with the return passage 124. This may result in making the case 100 slim.

The heat exchangers 127 are disposed in the rear surface 102 of the case 100 so as to obtain a larger area, and to secure cooling performance for reducing an increase in surface temperatures of the display panel 110 and the case 100 due to sunlight.

Other circuit elements, such as the main board 134, the power supply unit, the LED driver 135, and the like, other than the display panel 110, are disposed between the first and second heat exchangers 128, 129, and internal air flowing along the circulation passage 111 in the closed-loop structure, for example, in the shape like "O", can simultaneously cool the front surface of the display panel 110, and heat-generating circuits, such as the power supply unit, the LED driver 135, and the like. This may result in satisfying lifespans and reliability required for the display panel 110 and other circuit elements.

Since an LED backlight may be disposed on the rear surface of the display panel 110, external air introduced through the cooling passage 123 can easily cool the LED backlight.

With the configuration that the plurality of intake ports 116 and exhaust ports 117 are located at the top surface 104 of the case 100, the plurality of intake guides 118 extends from the intake ports 116 to be inclined downward from the front to the rear insides the case 100, and the plurality of exhaust guides 119 extends from the exhaust ports 117 to be inclined upward from the front to the rear insides the case 100, hot air discharged from the top surface 104 of the case 100 can be prevented from re-circulating into the intake ports 116.

Figure 8:
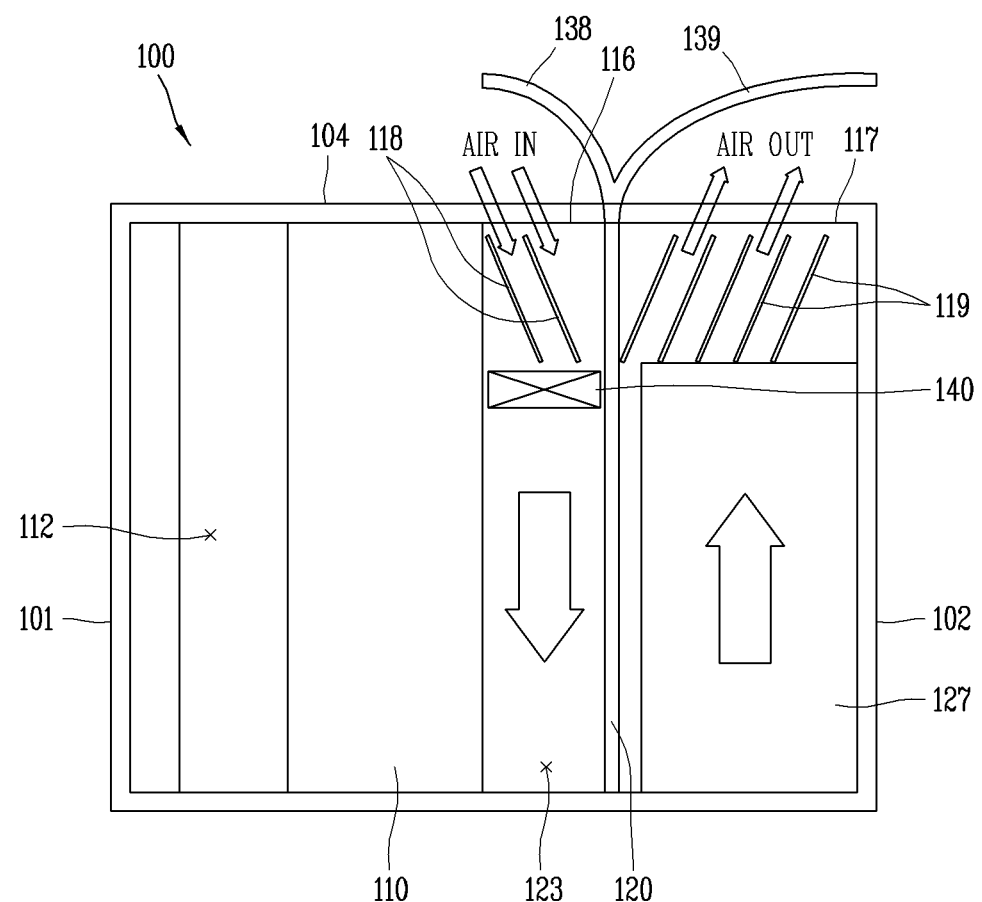
FIG. 8 is a conceptual view illustrating a state in which an intake cover and an exhaust cover are further mounted on the top surface of the case in FIG. 6.

FIG. 8 is a conceptual view illustrating a state in which an intake cover 138 and an exhaust cover 139 are further mounted on the top surface 104 of the case 100.

This embodiment differs from the foregoing embodiment illustrated in FIGS. 1 to 7 in that an intake cover 138 and an exhaust cover 139 are provided on top portions of the intake port 116 and the exhaust port 117, respectively.

The intake cover 138 may be configured to cover the top portion of the intake port 116. One end of the intake cover 138 may communicate with outside, and another end of the intake cover 138 may communicate with the intake port 116.

The intake cover 138 may extend in the right and left directions of the case 100. The intake cover 138 may be open to the front of the case 100.

A filter 140 may be installed below the intake guides 118 to prevent dust or foreign substances from being introduced into the cooling passage 123.

The exhaust cover 139 may cover the top portion of the exhaust port 117. One end of the exhaust cover 139 may communicate with outside, and another end of the exhaust cover 139 may communicate with the exhaust port 117.

The exhaust cover 139 may extend in the right and left directions of the case 100. The exhaust cover 139 may be open to the rear of the case 100.

With this configuration, the intake cover 138 and the exhaust cover 139 can prevent an introduction of rain or snow into the external air passage 122.

As the filter 140 is installed inside the intake port 116, the introduction of dust or foreign substances into the external air passage 122 and accumulation of contaminants in the external air passage 122 can be prevented, thereby solving a problem of decreased cooling performance due to such foreign substances and contaminants.

Figure 9:
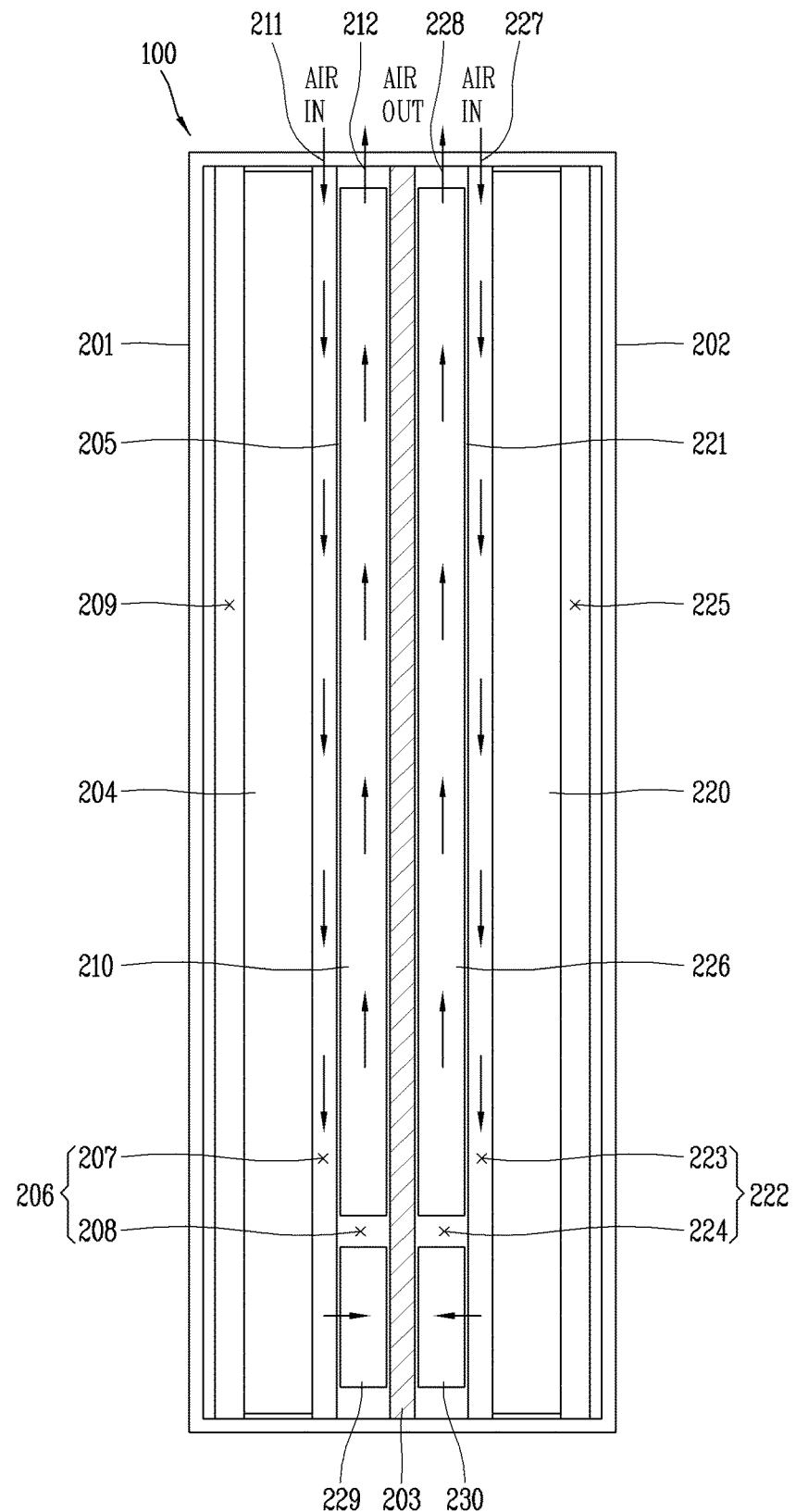
FIG. 9 is a conceptual view illustrating a double-sided display device in accordance with a second embodiment of the present disclosure.

FIG. 9 is a conceptual view illustrating a double-sided display device in accordance with a second embodiment of the present disclosure.

This embodiment differs from the foregoing embodiments illustrated in FIGS. 1 to 8 in that a double-sided display panel 204, 220 is provided.

A double-sided display device may be configured by arranging a first display panel 204 and a second display panel 220 on a front surface 201 and a rear surface 202 of a case 200, respectively. A central partition wall 203 may be installed inside the case 200, to divide an inner accommodation space of the case 200 into a front part and a rear part.

Screens of the first and second display panels 204 and 220 may be displayed in front and rear directions of the case through the front surface 201 and the rear surface 202 of the case 200.

Each of the front part and the rear part may be divided into two layers in the front and rear directions.

A first layer and a second layer of the front part may be partitioned by a front partition wall 205.

The first display panel 204 may be accommodated in the first layer of the front part.

A first external air passage 206 through which external air is introduced into a rear surface of the first display panel 204 may include a first cooling passage 207 and a first return passage 208. The first cooling passage 207 may be defined between the rear surface of the display panel 204 and the front partition wall 205. The first return passage 208 may be defined in the second layer of the front part to return external air from the first cooling passage 207.

A first circulation passage for cooling the first display panel 204 may include a front passage 209 and side passages of the case 200, and a first rear passage defined between a rear surface of the front partition wall 205 and the central partition wall 203.

A plurality of heat exchangers 210 may be installed in the second layer of the front part. The plurality of heat exchangers 210 may cause heat exchange between external air flowing in a shape like "U" along the first external air passage 206 and internal air circulating in a shape like "O" along the first circulation passage.

External air may be introduced through the intake port 211 formed through a top surface of the front part of the case 200 and flow down along the first cooling passage 207 so as to directly cool the rear surface of the first display panel 204, and simultaneously internal air may cool the front surface of the first display panel 204, and other circuit elements such as a main board, SMPSs, an LED driver, etc.

Subsequently, the external air may be turned by the first return passage 208 formed in the second layer of the front part to flow upward along the second passage part of the heat exchangers 210 accommodated in the second layer of the front part, thereby being discharged externally through the exhaust port 117 formed through the top surface of the front part.

Meanwhile, a first layer of the rear part may be formed adjacent to the rear surface 202 of the case 200 at an opposite side to the first layer of the front part.

A first layer and a second layer of the rear part may be partitioned by a rear partition wall 221. The second display panel 220 may be accommodated in the first layer of the rear part.

A second external air passage 222 through which external air is introduced into a rear surface of the second display panel 220 may include a second cooling passage 223 and a second return passage 224.

The second cooling passage 223 may be defined between the rear surface of the second display panel 220 and the rear partition wall 221. The second return passage 224 may be formed in the second layer of the rear part to return external air from the second cooling passage 223.

A second circulation passage for cooling the second display panel 220 may include a rear passage 225 and side passages of the case 200, and a second rear passage defined between a rear surface of the second partition wall 221 and the central partition wall 203.

A plurality of heat exchangers 226 may be installed in the second layer of the rear part. The plurality of heat exchangers 226 may cause heat exchange between external air flowing in a shape like "U" along the second external air passage 222 and internal air circulating in a shape like "O" along the second circulation passage.

External air may be introduced through the intake port 227 formed through a top surface of the rear part of the case 200 and flow down along the second cooling passage 223 so as to directly cool the rear surface of the second display panel 220, and simultaneously internal air may cool the front surface of the second display panel 220 and other circuit elements, such as a main board, SMPSs, an LED driver, etc.

Subsequently, the external air may be turned by the second return passage 224 formed in the second layer of the rear part to flow upward along the second passage part of the heat exchangers 226 accommodated in the second layer of the rear part, thereby being discharged externally through the exhaust port 228 formed through the top surface of the rear part.

Since other components are the same as or similar to those in the first embodiment, duplicated descriptions will be omitted.

Figure 10:
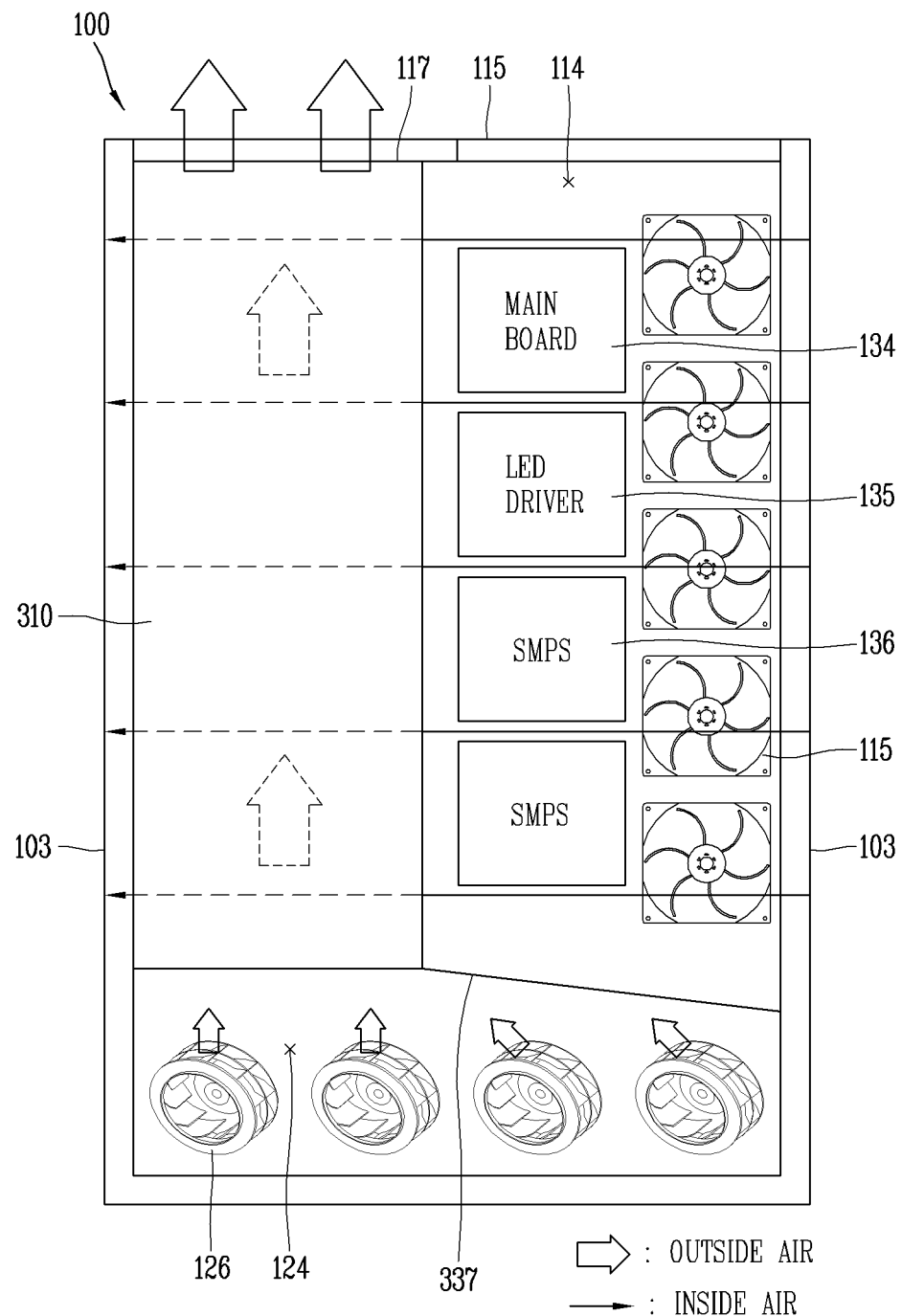
FIG. 10 is a conceptual view illustrating an arrangement of heat exchangers when viewed from a rear surface of a case in accordance with a third embodiment of the present disclosure.
Figure 11:
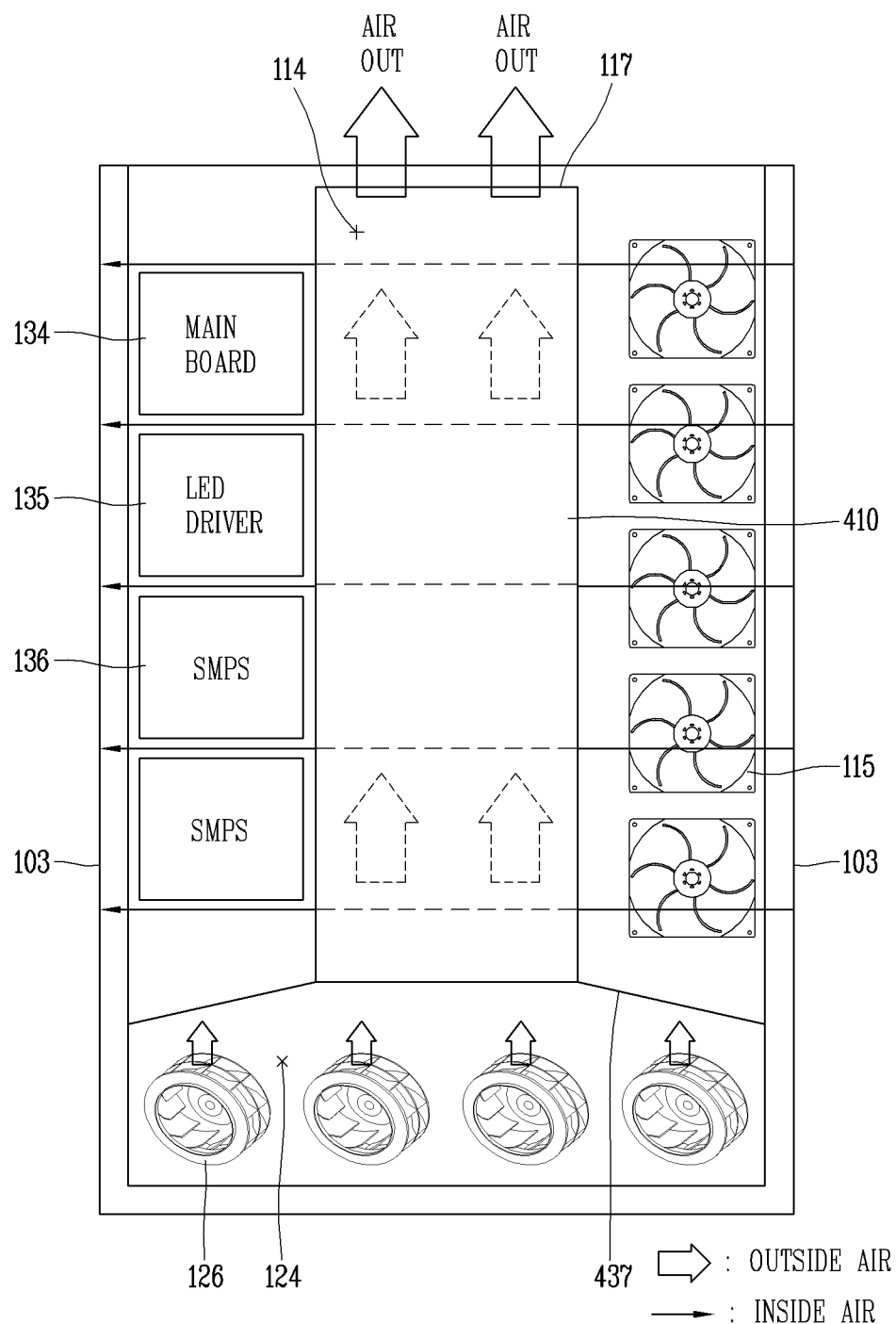
FIG. 11 is a conceptual view illustrating an arrangement of heat exchangers when viewed from a rear surface of a case in accordance with a fourth embodiment of the present disclosure.

FIG. 10 is a conceptual view illustrating an arrangement of heat exchangers 310 when viewed from the rear surface 102 of the case 100 in accordance with a third embodiment of the present disclosure, and FIG. 11 is a conceptual view illustrating an arrangement of heat exchangers 410 when viewed from the rear surface 102 of the case 100 in accordance with a fourth embodiment of the present disclosure.

The third embodiment differs from the first embodiment in that the heat exchangers 310 are disposed at a left side in a rear passage 114 of the case 100 when viewed from the rear surface 102 of the case 100. A plurality of circulation fans 115 may be disposed at a right side in the rear passage 114. The main board 134, the LED driver 135, and the plurality of SMPSs 136 may be disposed between the heat exchangers 310 and the plurality of circulation fans 115.

A lower partition wall 337 may isolate the rear passage 114 and the return passage 124 from each other, and may be upwardly inclined with respect to a horizontal line from a right end to a left end. The lower partition wall 337 may guide external air sucked by the plurality of suction fans 126 to the second passage parts 133 of the heat exchangers 310.

The fourth embodiment differs from the first embodiment in that heat exchangers 410 are disposed at a central portion in the rear passage 114 of the case 100 when viewed from the rear surface 102 of the case 100. The plurality of circulation fans 115 may be disposed at a right side in the rear passage 114.

The main board 134, the LED driver 135, and the plurality of SMPSs 136 may be disposed in a left side of the rear passage 114.

A lower partition wall 437 may isolate the rear passage 114 and the return passage 124 from each other, and may be disposed at each of both right and left sides of the rear passage 114. Each of the plurality of lower partition walls 437 may be upwardly inclined from both right and left ends of the rear passage 114 to the heat exchanger 410. The plurality of lower partition walls 437 may guide external air sucked by the plurality of suction fans 126 to the second passage parts 133 of the heat exchangers 410.

Since other components are the same as or similar to those in the first embodiment, duplicated descriptions will be omitted.

Figure 12:
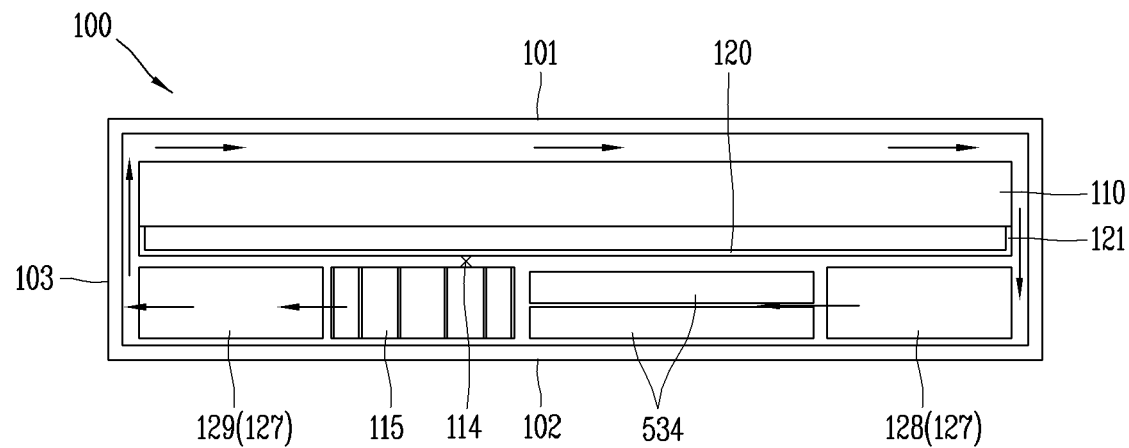
FIG. 12 is a planar view illustrating PCBs stacked into multi layers in a rear passage in front and rear directions in accordance with a fifth embodiment of the present disclosure.

FIG. 12 is a planar view illustrating PCBs 534 stacked into multi layers in the rear passage 114 in the front and rear directions in accordance with a fifth embodiment of the present disclosure.

This embodiment shows a state in which a plurality of PCBs 534 is stacked in the front and rear directions in the rear passage 114. The plurality of PCBs 534 may be disposed between heat exchangers 129 and 128 disposed in right and left sides of the rear flow passage 114.

The circulation fans 115 and the plurality of PCBs 534 may be disposed between the heat exchangers 129 and 128 disposed at the both right and left sides in the rear flow passage 114. Here, the circulation fans 115 may be disposed adjacent to the second heat exchanger 129 disposed at the left side, and the plurality of PCBs 534 may be disposed adjacent to the first heat exchanger 128 disposed at the right side.

The plurality of PCBs 534 may be arranged in parallel.

Since other components are the same as or similar to those in the first embodiment, duplicated descriptions will be omitted.

Figure 13:
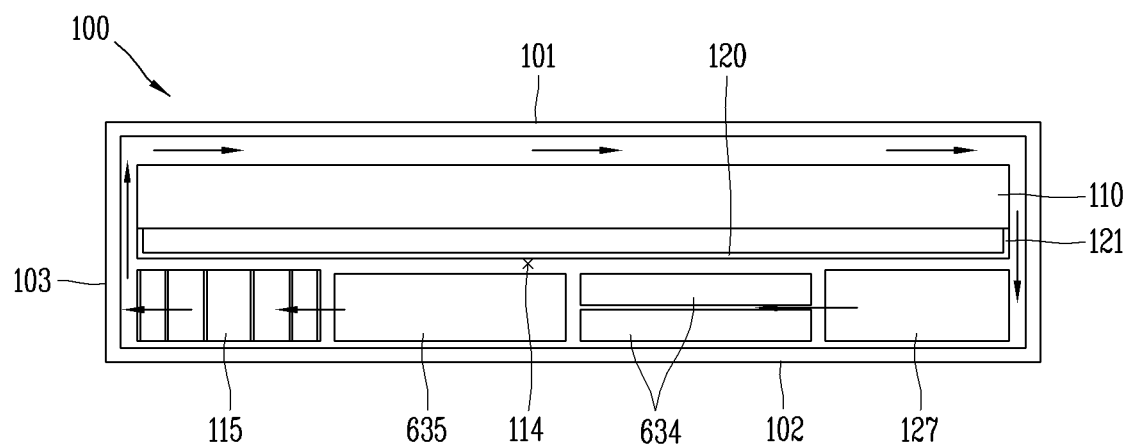
FIG. 13 is a planar view illustrating a plurality of PCBs arranged in series and in parallel in a rear passage in accordance with a sixth embodiment of the present disclosure.

FIG. 13 is a planar view illustrating a plurality of PCBs 634 and 635 arranged in series and in parallel in the rear passage 114 in accordance with a sixth embodiment of the present disclosure.

This embodiment shows a state in which a plurality of PCBs 634 and 635 is arranged in series and in parallel in the rear passage 114. The plurality of PCBs 634 and 635 may be configured in two rows at a central portion in the rear passage 114. The PCB 635 may be arranged in series on the left row of the two rows in the central portion, and the plurality of PCBs 634 may be arranged in parallel on the right row.

The heat exchanger 127 may be disposed at a right end portion in the rear passage 114. The circulation fans 115 may be disposed at a left end portion in the rear passage 114.

Since other components are the same as or similar to those in the third embodiment, duplicated descriptions will be omitted.

What is claimed is:

1. A display device, comprising:
   a case having a front surface on which a display screen is displayed, a rear surface opposite to the front surface, a top surface connecting upper ends of the front surface and the rear surface, and a bottom surface opposite to the top surface;
   a display panel accommodated in the case;
   a heat exchanger mounted inside the case and configured to cause heat exchange between internal air circulating along front and rear surfaces of the display panel and external air introduced from outside of the case;
   a suction fan mounted inside the case and configured to suction the external air into a lower portion of the heat exchanger;
   a plurality of intake ports formed through the top surface of the case and through which external air is suctioned;
   a plurality of exhaust ports formed through the top surface of the case through which the external air heat-exchanged with the internal air is discharged;
   a plurality of intake guides communicating with the intake port and inclined toward the rear surface of the case inside the case; and
   a plurality of exhaust guides communicating with the exhaust port and inclined toward the front surface of the case inside the case such that external air discharged through the exhaust port is isolated from external air introduced into the intake port.

2. The device of claim 1, wherein the suction fan is disposed below the heat exchanger.

3. The device of claim 1, further comprising a cooling passage defined at a rear surface of the display panel so that the external air flows therethrough so as to cool the display panel.

4. The device of claim 3, wherein the heat exchanger is disposed at the rear of the cooling passage.

5. The device of claim 3, wherein the cooling passage has the same size as the display panel.

6. The device of claim 3, wherein the suction fan is disposed between the cooling passage and the heat exchanger to allow the external air passed through the cooling passage to be discharged into a lower portion of the heat exchanger.

7. The device of claim 3, wherein the suction fan is disposed in a lower portion of the cooling passage.

8. The device of claim 3, wherein the display panel is provided with a backlight on a rear surface thereof, and the backlight is cooled by the external air.

9. The device of claim 1, further comprising:
   a circulation passage defined in a closed-loop shape in the case so that the internal air circulates therealong; and
   a circulation fan providing circulation power to the internal air,
   wherein the circulation passage is defined in a shape of "O" by comprising:
   a front passage defined between the front surface of the case and the front surface of the display panel;
   a rear passage defined in the rear surface of the case to be opposite to the front passage; and
   a plurality of side passages respectively defined in both side surfaces of the case and configured to communicate the front passage with the rear passage.

10. The device of claim 9, wherein the heat exchanger is provided by one in number, installed in the rear of the case to be located in a central portion of the case or to be located adjacent to a side of the case.

11. The device of claim 9, further comprising:
    an intake port formed through the top surface of the case;
    an exhaust port formed through the top surface of the case to be spaced rearward from the intake port; and
    an external air passage having one side communicating with the intake port and another side communicating with the exhaust port, and extending in a direction intersecting with the circulation passage inside the case.

12. The device of claim 1, wherein the heat exchanger is provided in plurality in the rear of the case, and disposed to be spaced apart from each other in right and left directions of the case.

13. A display device, comprising:
    a case having a front surface on which a display screen is displayed, a rear surface opposite to the front surface, a top surface connecting upper ends of the front surface and the rear surface, and a bottom surface opposite to the top surface;
    a display panel accommodated in the case;
    a heat exchanger mounted inside the case and configured to cause heat exchange between internal air circulating along front and rear surfaces of the display panel and external air introduced from outside of the case;
    a suction fan mounted inside the case and configured to suck the external air into a lower portion of the heat exchanger;
    an intake port formed through the top surface of the case;
    an exhaust port formed through the top surface of the case to be spaced rearward from the intake port; and
    an external air passage having one side communicating with the intake port and another side communicating with the exhaust port,
    wherein the external air passage comprises:
    a cooling passage disposed at the rear surface of the display panel and extending downward from the intake port; and
    a return passage disposed at the rear surface of the cooling passage, having a lower side communicating with a lower end of the cooling passage and an upper side extending upward toward the exhaust port so that the external air is returned to the exhaust port,
    wherein the suction fan is disposed between a lower side of the cooling passage and a lower side of the return passage.

14. The device of claim 13, further comprising:
    a circulation passage defined in a closed-loop shape in the case so that the internal air circulates along the circulation passage; and a circulation fan configured to circulate the internal air,
wherein the external air passage extends in a direction that intersects with a direction of the circulation passage inside the case.

15. The device of claim 13, wherein the external air passage is defined in a "U" shape.

\* \* \* \* \*